US009268163B2

(12) United States Patent
Park

(10) Patent No.: US 9,268,163 B2
(45) Date of Patent: Feb. 23, 2016

(54) FLEXIBLE DISPLAY DEVICE

(71) Applicant: Samsung Display Co., Ltd., Yongin, Gyeonggi-Do (KR)

(72) Inventor: Hye-Jung Park, Yongin (KR)

(73) Assignee: Samsung Display Co., Ltd., Giheung-Gu, Yongin-si, Gyeonggi-Do (KR)

( * ) Notice: Subject to any disclaimer, the term of this patent is extended or adjusted under 35 U.S.C. 154(b) by 102 days.

(21) Appl. No.: 13/924,482

(22) Filed: Jun. 21, 2013

(65) Prior Publication Data

US 2014/0204509 A1 Jul. 24, 2014

(30) Foreign Application Priority Data

Jan. 24, 2013 (KR) ........................ 10-2013-0008213

(51) Int. Cl.
*G06F 1/16* (2006.01)
*G09G 5/00* (2006.01)
*G02F 1/1333* (2006.01)
*G09F 9/30* (2006.01)
*F16K 31/00* (2006.01)
*G05D 15/01* (2006.01)
*G02B 26/02* (2006.01)
*H01L 27/32* (2006.01)
*H01L 51/52* (2006.01)
*H02N 2/00* (2006.01)
*G02F 1/133* (2006.01)
*H01L 41/09* (2006.01)

(52) U.S. Cl.
CPC ........ *G02F 1/133305* (2013.01); *F16K 31/005* (2013.01); *G02B 26/026* (2013.01); *G05D 15/01* (2013.01); *G06F 1/1652* (2013.01); *G09F 9/301* (2013.01); *H01L 27/32* (2013.01); *H01L 51/524* (2013.01); *G02F 1/133308* (2013.01); *G02F 2001/13312* (2013.01); *G02F 2001/133394* (2013.01); *G02F 2201/58* (2013.01); *H01L 41/0926* (2013.01); *H01L 2251/5323* (2013.01); *H02N 2/005* (2013.01)

(58) Field of Classification Search
CPC ... G02F 1/167; G02F 1/133305; G09G 3/344; G09F 9/372; G09F 9/301; G06F 1/1652; H05K 1/0393
USPC ........................................................ 361/749
See application file for complete search history.

(56) References Cited

U.S. PATENT DOCUMENTS

| 5,051,652 | A | 9/1991 | Isomura et al. | |
| 5,747,152 | A | 5/1998 | Oka et al. | |
| 2010/0188422 | A1* | 7/2010 | Shingai et al. | 345/647 |
| 2011/0188189 | A1* | 8/2011 | Park et al. | 361/679.05 |

FOREIGN PATENT DOCUMENTS

| KR | 10-1996-0004588 | 4/1996 |
| KR | 10-0179061 | 5/1999 |
| KR | 10-2011-0006787 | 1/2011 |
| WO | 2008/150600 | 12/2008 |

* cited by examiner

*Primary Examiner* — Lixi C Simpson
*Assistant Examiner* — Ngan Pham Lu
(74) *Attorney, Agent, or Firm* — Robert E. Bushnell, Esq.

(57) ABSTRACT

A flexible display device includes a flexible display panel including a display unit; and a deformation member located on the flexible display panel. The deformation member is deformed due to external light that is incident on the flexible display device, and thus the flexible display device is deformed, thereby allowing the external light to be blocked.

13 Claims, 10 Drawing Sheets

FLEXIBLE DISPLAY DEVICE

CLAIM OF PRIORITY

This application makes reference to, incorporates the same herein, and claims all benefits accruing under 35 U.S.C. §119 from an application earlier filed in the Korean Intellectual Property Office on 24 Jan. 2013 and there duly assigned Serial No. 10-2013-0008213.

BACKGROUND OF THE INVENTION

1. Field of the Invention

An embodiment of the present invention relates to a flexible display device, and more particularly, to a flexible display device that blocks external light to reduce reflection by the external light thereby improving visibility.

2. Description of the Related Art

Display devices refer to devices that display an image signal. Such display devices include all devices that display an image signal input from the exterior, for example, a television, a computer monitor, a personal digital assistant (PDA), a smart device that has recently been increasingly demanded, and the like.

High-definition flat plate type display modules, such as an organic light-emitting display panel, a liquid crystal display panel, a plasma display panel, or an electro-phoretic display panel are used as the display devices.

Recently, there have been developed flexible display devices which are capable of achieving a reduction in weight and thickness, having higher portability, and being able to be bent or folded. Flexible display devices can be implemented using a flexible substrate such as plastic, instead of a glass substrate.

SUMMARY OF THE INVENTION

An embodiment of the present invention provides a flexible display device that blocks external light to reduce reflection by the external light, and thereby improves visibility.

In accordance with an aspect of the present invention, a flexible display device may include a flexible display panel including a display unit; and a deformation member located on the flexible display panel. The deformation member is deformed due to external light that is incident on the flexible display device, and thus the flexible display device is deformed, thereby allowing the external light to be blocked.

When the external light is incident on the deformation member, the deformation member may react to the external light, and thereby is bent in a direction in which an image is displayed by the flexible display device.

The deformation member may be bent, and thus an upper portion of the flexible display may be bent.

The flexible display device may further include a sensor unit that senses the external light.

When the external light is sensed by the sensor unit, a signal may be applied to the deformation member, and thus the deformation member may be bent in a direction in which an image is displayed by the flexible display device.

When the external light is sensed and the intensity of the external light sensed by the sensor unit is equal to or greater than a predetermined value, a signal may be applied to the deformation member, and thus the deformation member may be bent in a direction in which an image is displayed by the flexible display device.

The degree of deformation of the deformation member may be proportional to the intensity of the external light sensed by the sensor unit.

The deformation member may be deformed, and thus an upper portion of the flexible display device may be bent.

The flexible display device may further include a control unit that controls the deformation of the deformation member by controlling a signal applied to the deformation member on the basis of the intensity of the external light sensed by the sensor unit.

The deformation of the deformation member may include bending the deformation member in a direction in which an image is displayed by the flexible display device.

When the deformation member is bent, an upper portion of the flexible display device may be bent.

The external light may be sunlight.

The deformation member may be a piezoelectric element.

The deformation member may be located at the corner of the flexible display device, and a longitudinal direction of the deformation member may face the corner.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Various changes in form and details may be made to the present inventive concept and thus should not be construed as being limited to the embodiments set forth herein. The inventive concept is not limited to the embodiments described in the present description, and thus it should be understood that the inventive concept does not include every kind of variation example or alternative equivalent included in the spirit and scope of the inventive concept. Also, while describing the embodiments, detailed descriptions about related well-known functions or configurations that may diminish the clarity of the points of the embodiments of the present invention will be omitted.

In the present description, terms such as 'first', 'second', etc. are used to describe various elements. However, it is obvious that the elements should not be defined by these terms. The terms are used only for distinguishing one element from another element.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments of the present invention will be described in detail with reference to the accompanying drawings.

Figure 1A:
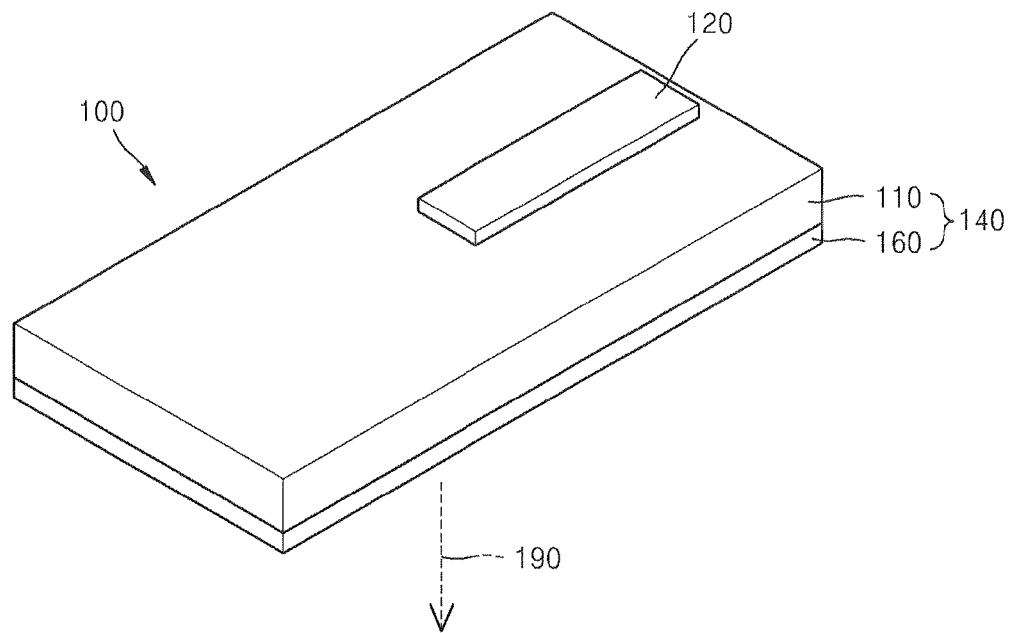
FIG. 1A is a schematic perspective view illustrating a flexible display device according to an embodiment of the present invention.
Figure 1B:
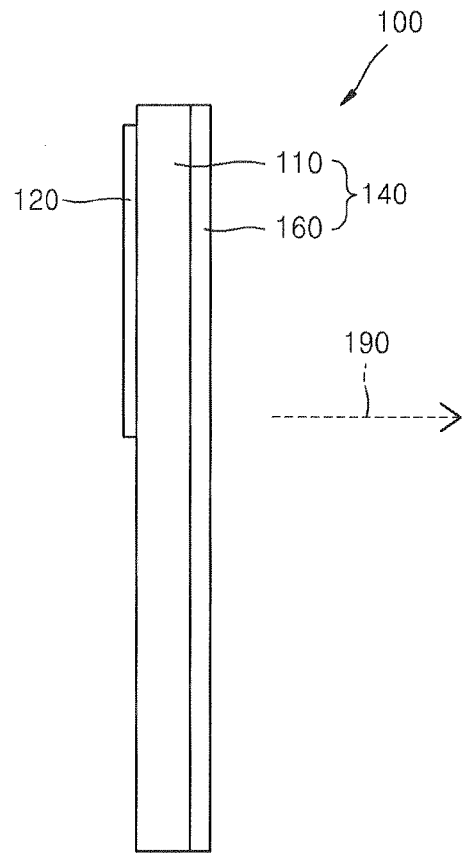
FIG. 1B is a schematic side view illustrating the flexible display device of FIG. 1A.

FIG. 1A is a schematic perspective view illustrating a flexible display device 100 according to an embodiment of the present invention. FIG. 1B is a schematic side view illustrating the flexible display device 100 of FIG. 1A.

In reference to FIGS. 1A and 1B, the flexible display device 100 includes a flexible display panel 140 and a deformation member 120. The flexible display panel 140 includes a flexible substrate 110 and a display unit 160.

The flexible substrate 110 may be formed of a plastic material having excellent heat-resisting property and durability, for example, polyethyleneetherphthalate, polyethylenenaphthenate, polycarbonate, polyarylate, polyetherimide, polyethersulfone, or polyimide. However, the present invention is not limited thereto, and the flexible substrate 110 may be formed of any of various flexible materials.

The display unit 160 is formed on one surface of the flexible substrate 110 to display an image. The display unit 160 may include various display devices capable of displaying an image. For example, the display unit 160 may include an organic light-emitting device, an inorganic light-emitting device, a liquid crystal device, an electrophoretic device, or the like.

The deformation member 120 is formed on one surface of the flexible substrate 110. The deformation member 120 may be located at the top of the flexible display device 100, and a plurality of the deformation members 120 may be formed. When the plurality of deformation members 120 are formed, each deformation member 120 may be independently deformed.

The deformation member 120 may be formed of a piezoelectrical material. In this case, when a signal is applied to the piezoelectrical material, the piezoelectrical material is mechanically deformed. The piezoelectrical material may be crystal or ceramic materials, or may be quartz. Alternatively, the deformation member 120 may be formed of lead-zirconate-titanate (PZT), lead-titanate (PbTiO2), lead-zirconate (PbZrO3), or brium-titanate (BaTiO3). However, the present invention is not limited thereto, and the deformation member 120 may be formed of any of various deformable materials. Alternatively, the deformation member 120 may be formed of a material that reacts to external light to be thus deformed.

Figure 2A:
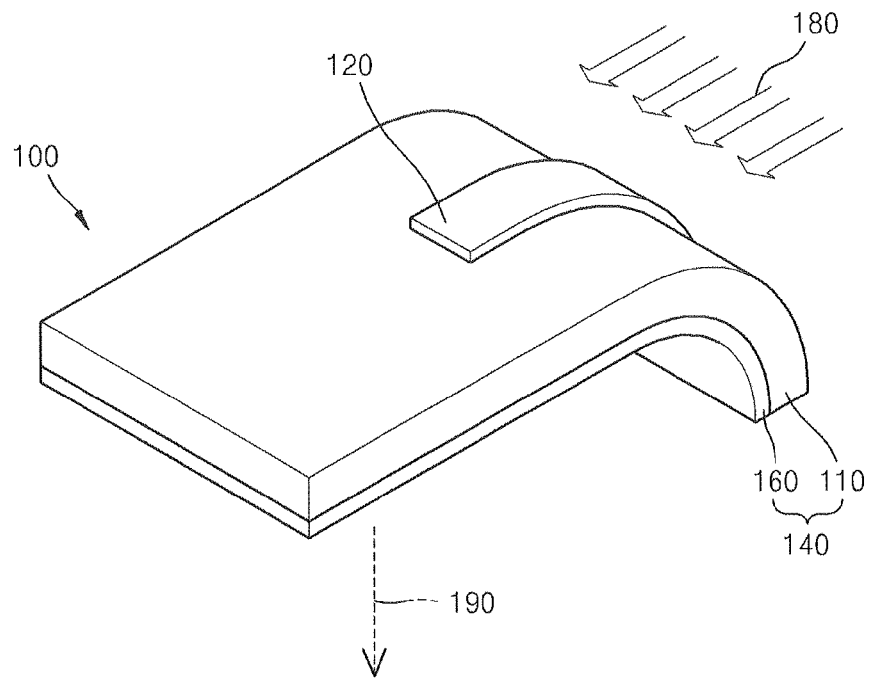
FIG. 2A is a schematic perspective view illustrating the flexible display device that is deformed when external light is incident on the flexible display device of FIG. 1A.
Figure 2B:
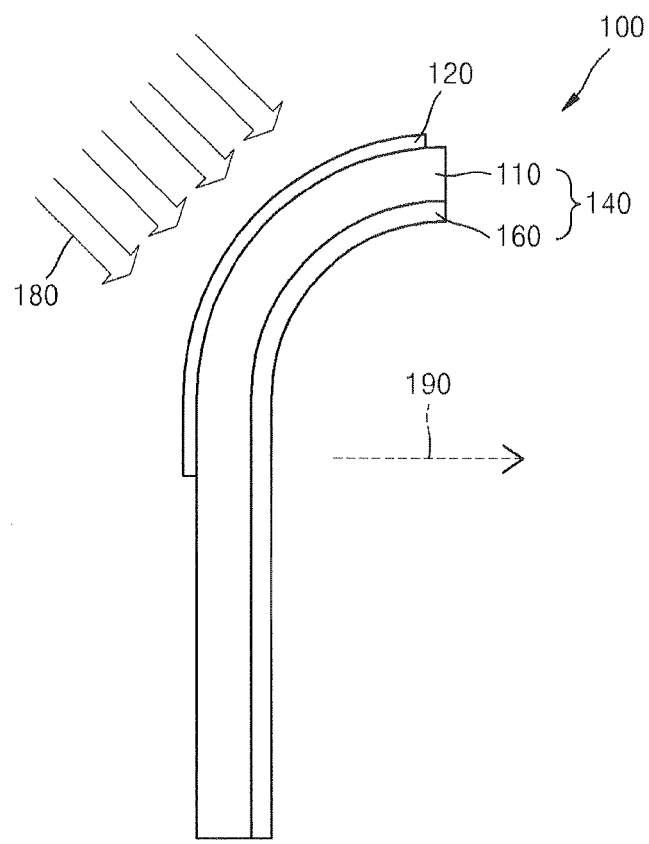
FIG. 2B is a schematic side view illustrating the flexible display device of FIG. 2A.

FIG. 2A is a schematic perspective view illustrating the flexible display device 100 that is deformed when external light is incident on the flexible display device 100 of FIG. 1A. FIG. 2B is a schematic side view illustrating the flexible display device 100 of FIG. 2A.

In reference to FIGS. 2A and 2B, when the deformation member 120 is deformed due to the external light 180 that is incident on the flexible display device 100, the flexible display device 100 is deformed accordingly, thereby allowing the external light 180 to be blocked. The external light 180 may be sunlight.

The deformation member 120 may react to the external light 180 to be thus bent in a direction 190 in which an image is displayed by the flexible display device 100. Accordingly, an upper portion of the flexible display device 100 is bent, and thus the external light 180 is blocked, thereby allowing influence due to reflection by the external light to be reduced. In other words, the flexible display device 100 itself blocks the external light 180 so that the same effect may be obtained as in the case where a clear image is also viewed even outdoors by shielding the external light 180 with user's hands. Therefore, the problem may be solved of a decrease in visibility occurring when the external light 180 is directly incident on the display unit 160 of the flexible display device 100 because the deformation member 120 is bent due to the external light 180. However, the present invention is not limited thereto, and the deformation member 120 may be deformed in various forms, and thus the flexible display device 100 may be deformed in various forms.

Figure 3:
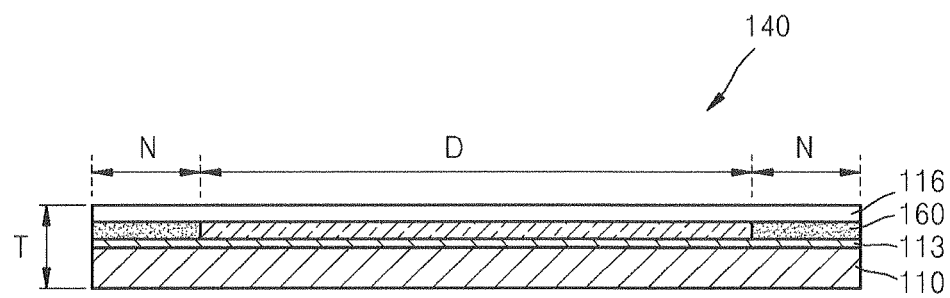
FIG. 3 is a schematic cross-sectional view illustrating an example of a flexible display panel of FIG. 1A.
Figure 4:
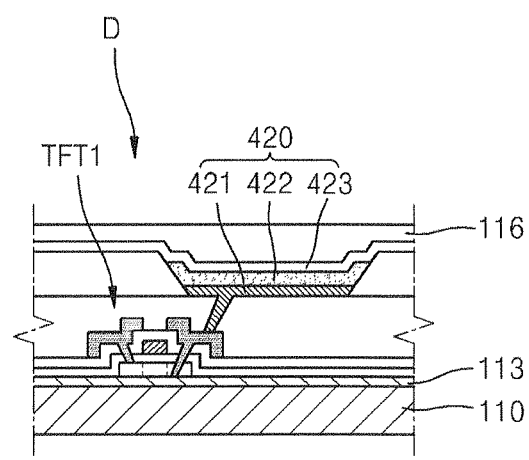
FIG. 4 is a cross-sectional view illustrating an example of a display region of FIG. 3.

FIG. 3 is a schematic cross-sectional view illustrating an example of the flexible display panel 140 of FIG. 1A. FIG. 4 is a cross-sectional view illustrating an example of a display region D of FIG. 3.

In reference to FIG. 3, the flexible display panel 140 includes a flexible substrate 110, a barrier film 113 disposed on the flexible substrate 110, the display unit 160 disposed on the barrier film 113, and an encapsulation portion 116. The display region D and a non-display region N may be formed in the display unit 160.

The flexible substrate 110 may be formed of a plastic material having excellent heat-resisting property and durability, for example, polyethyleneetherphthalate, polyethylenenaphthenate, polycarbonate, polyarylate, polyetherimide, polyethersulfone, or polyimide. However, the present invention is not limited thereto, and the flexible substrate 110 may also be formed of any of various flexible materials.

The barrier film 113 may be formed on the flexible substrate 110. The barrier film 113 may be formed of at least one of an inorganic film and an organic film. The barrier film 113 prevents unnecessary substances from penetrating the flexible substrate 110 and entering the display region D.

The display unit 160 is disposed on the barrier film 113, and the non-display region N located outside the display region D and the display region D may be formed in the display unit 160.

The display region D is a region in which an image signal is displayed, and various display devices (not shown) such as an organic light-emitting device, a liquid crystal display device, or an electro-phoretic device may be displayed in the display region D. In the current embodiment, an organic light-emitting device 420 of FIG. 4 will be described as an example. In addition, various devices such as a thin film transistor (not shown) or a capacitor (not shown) for driving the display device may further be disposed in the display region D.

In reference to FIG. 4, at least one organic light-emitting device 420 is provided in the display region D. The organic light-emitting device 420 includes a pixel electrode 421, a counter electrode 423 as a common layer, and an organic emission layer 422 interposed between the pixel electrode 421 and the counter electrode 423. The pixel electrode 421 is electrically connected to a driving thin film transistor TFT1 formed on the flexible substrate 110. Although not shown in FIG. 4, the organic light-emitting device 420 is electrically connected to at least switching thin film transistor and a storage capacitor so as to emit light in the display region D.

The light emitted from the organic emission layer 422 may be emitted toward the flexible substrate 110 or the encapsulation portion 116. In the current embodiment, a top emission type display device in which an image is displayed toward the encapsulation portion 116 will be described as an example. However, the present invention is not limited thereto, and the present invention may also be applied to a bottom emission type display device in which an image is displayed toward the flexible substrate 110.

The non-display region N may be provided with various circuits (not shown) and wirings (not shown) for applying an image signal to a display device located in the display region D.

Figure 5A:
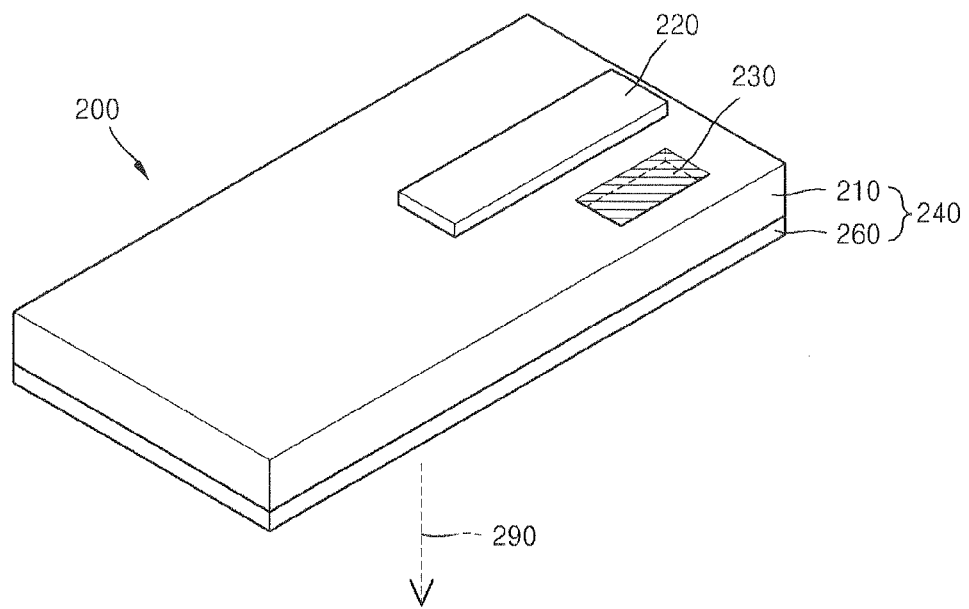
FIG. 5A is a schematic perspective view illustrating a flexible display device according to another embodiment of the present invention.
Figure 5B:
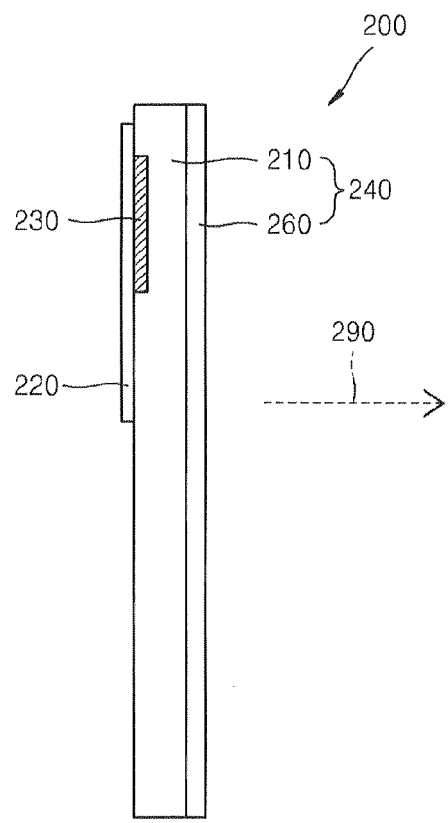
FIG. 5B is a schematic side view illustrating the flexible display device of FIG. 5A.

FIG. 5A is a schematic perspective view illustrating a flexible display device 200 according to another embodiment of the present invention. FIG. 5B is a schematic side view illustrating the flexible display device 200 of FIG. 5A.

Hereinafter, differences between the aforementioned embodiment of FIG. 1A and the current embodiment will be mainly described.

In reference to FIGS. 5A and 5B, the flexible display device 200 includes a flexible display panel 240, a deformation member 220, and a sensor unit 230. The flexible display panel 240 may include a flexible substrate 210 and a display unit 260.

The sensor unit 230 may be disposed on one surface of the flexible display panel 240 so as to sense external light.

Figure 6A:
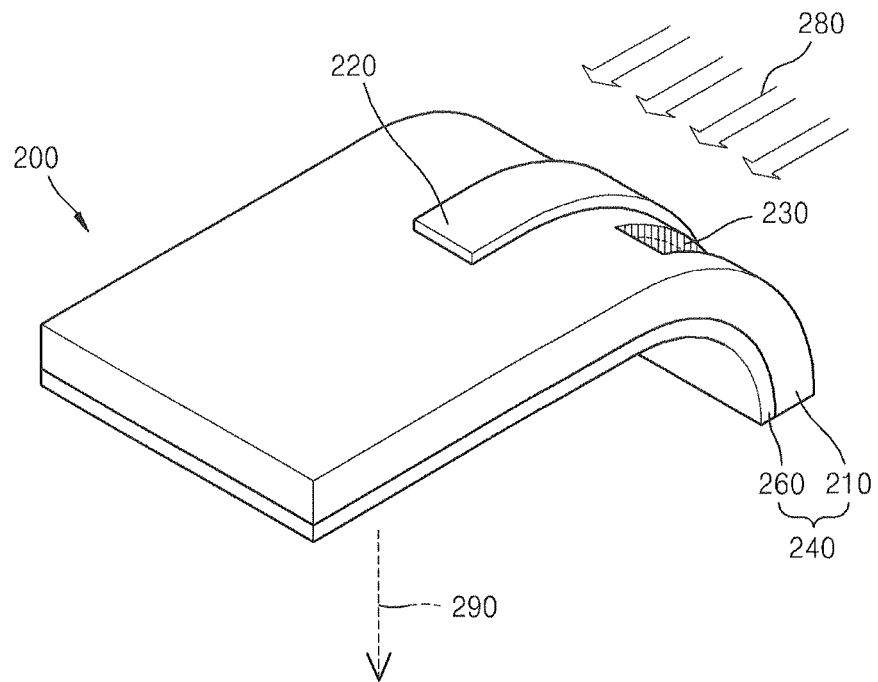
FIG. 6A is a schematic cross-sectional view illustrating the flexible display device that is deformed when external light is incident on the flexible display device of FIG. 5A.
Figure 6B:
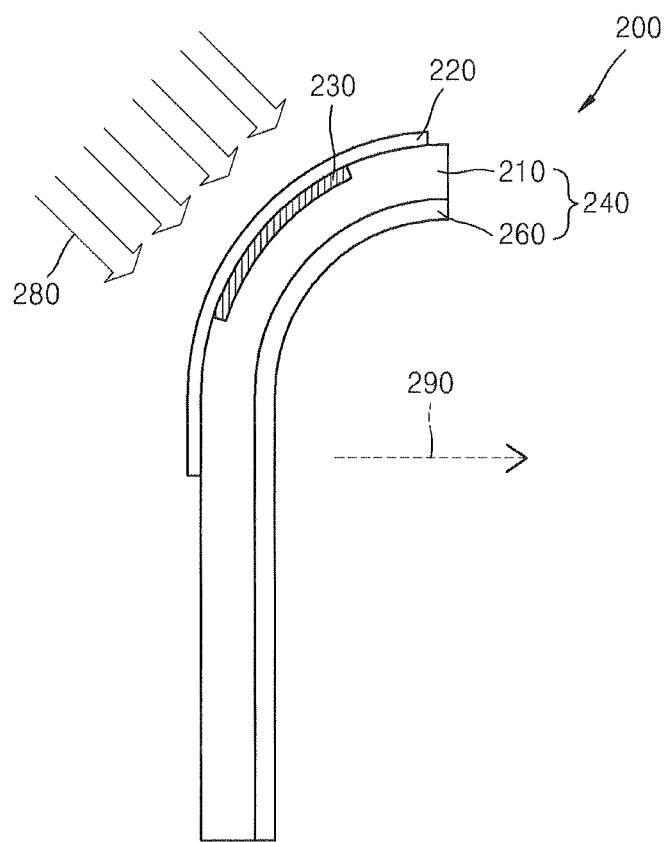
FIG. 6B is a cross-sectional view illustrating the flexible display device of FIG. 6A.

FIG. 6A is a schematic cross-sectional view illustrating the flexible display device 200 that is deformed when external light 280 is incident on the flexible display device 200 of FIG. 5A. FIG. 6B is a cross-sectional view illustrating the flexible display device 200 of FIG. 6A.

In reference to FIGS. 6A and 6B, when the external light 280 is incident on the flexible display device 200, the sensor unit 230 may sense the external light 280. When the external light 280 is sensed by the sensor unit 230, a signal is applied to the deformation member 220, and thus the deformation member 220 may be deformed.

In addition, a signal may be applied to the deformation member 220 only when the intensity of the external light 280 sensed by the sensor unit 230 is equal to or greater than a predetermined value so as to deform the deformation member 220. In this case, the degree of deformation of the deformation member 220 may be proportional to the intensity of the external light 280 sensed by the sensor unit 230.

The flexible display device 200 is deformed in association with the deformation of the deformation member 220, and thus the external light 280 may be blocked. The external light 280 may be sunlight.

When a signal is applied to the deformation member 220, the deformation member 220 may be bent in a direction 290 in which an image is displayed by the flexible display device 200. Thus, an upper portion of the flexible display device 200 is bent so as to block the external light 280, thereby allowing influence due to reflection by the external light to be reduced. In other words, the flexible display device 200 itself blocks the external light 280 so that the same effect may be obtained as in the case where a clear image is also viewed even outdoors by shielding the external light 280 with user's hands. Therefore, the problem may be solved of a decrease in visibility occurring when the external light 280 is directly incident on the display unit 260 of the flexible display device 200 because the deformation member 220 is bent due to the external light 280. However, the present invention is not limited thereto, and the deformation member 220 may be deformed in various forms, and thus the flexible display device 200 may be deformed in various forms.

Figure 7:
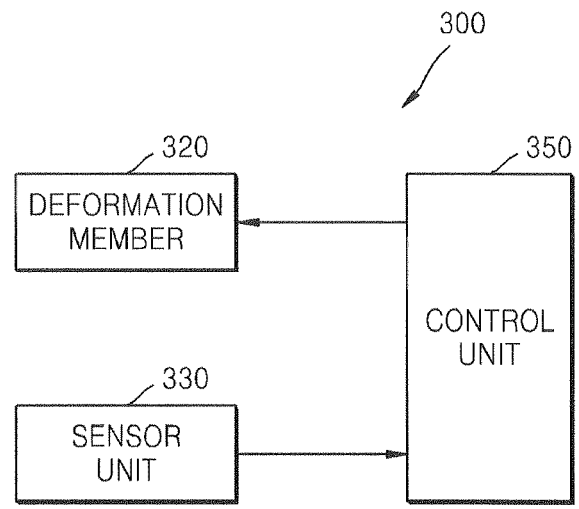
FIG. 7 is a schematic block diagram illustrating a flexible display device according to another embodiment of the present invention.

FIG. 7 is a schematic block diagram illustrating a flexible display device 300 according to another embodiment of the present invention.

Hereinafter, differences between the aforementioned embodiment of FIG. 5A and the current embodiment will be mainly described.

In reference to FIG. 7, the flexible display device 300 includes a sensor unit 330, a control unit 350, and a deformation member 320.

When external light is incident on the flexible display device, the sensor unit 330 senses the external light. The control unit 350 controls a signal applied to the deformation member 320 on the basis of the intensity of the external light sensed by the sensor unit 330, thereby allowing the deformation of the deformation member 320 to be controlled.

When the deformation member 320 controlled by the control unit 350 is deformed, the flexible display device 300 is deformed, thereby allowing the external light to be blocked. The external light may be sunlight.

When the signal controlled by the control unit 350 is applied to the deformation member 320, the deformation member 320 may be bent in a direction in which an image is displayed by the flexible display device 300. Accordingly, an upper portion of the flexible display device 300 is bent, and thus the external is blocked, thereby allowing influence due to reflection by the external light to be reduced. In other words, the flexible display device 300 itself blocks the external light so that the same effect may be obtained as in the case where a clear image is also viewed even outdoors by shielding the external light with user's hands. Therefore, the problem may be solved of a decrease in visibility occurring when the external light is directly incident on a display unit of the flexible display device 300 because the deformation member 320 is bent due to the external light. However, the present invention is not limited thereto, and the deformation member 320 may be deformed in various forms, and thus the flexible display device 300 may be deformed in various forms.

Figure 8A:
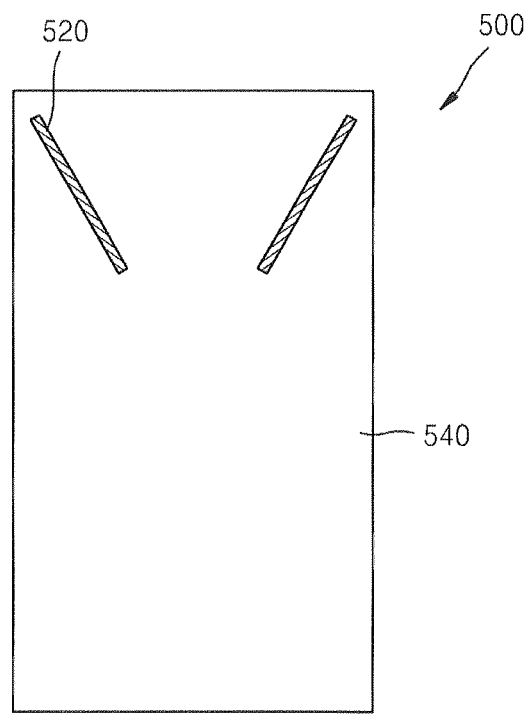
FIG. 8A is a schematic plan view illustrating a flexible display device according to another embodiment of the present invention.
Figure 8B:
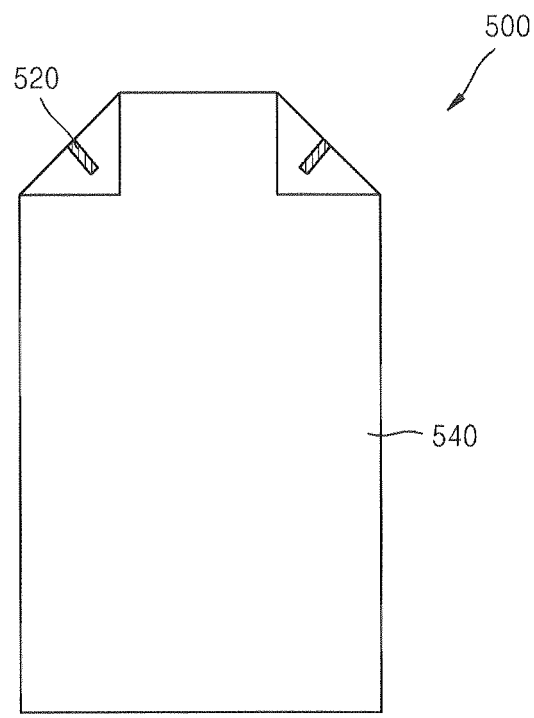
FIG. 8B is a schematic plan view illustrating the flexible display device that is deformed when external light is incident on the flexible display device of FIG. 8A.
Figure 8C:
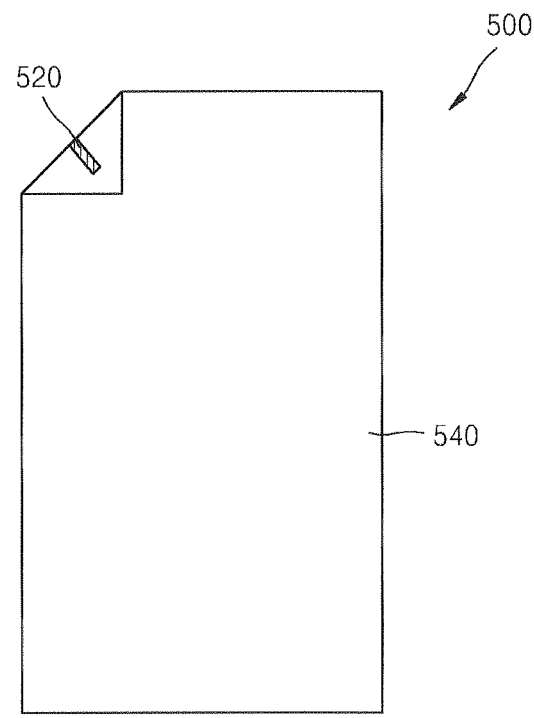
FIG. 8C is a schematic plan view illustrating the flexible display device that is deformed when external light is incident on the flexible display device of FIG. 8A.
Figure 8D:
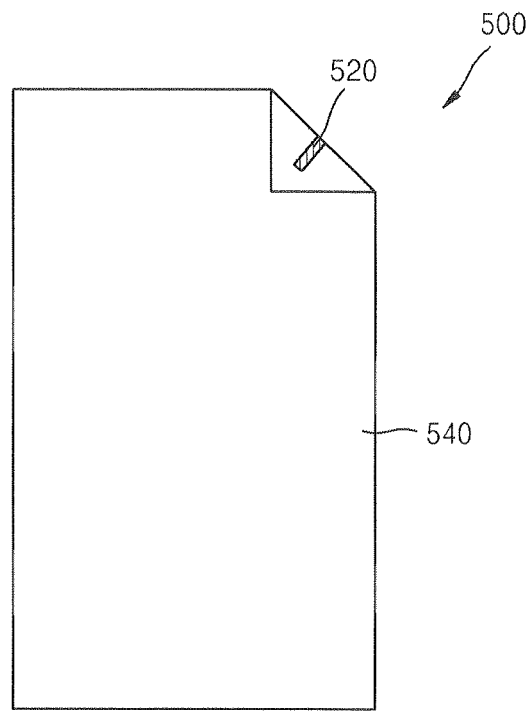
FIG. 8D is a schematic plan view illustrating the flexible display device that is deformed when external light is incident on the flexible display device of FIG. 8A.

FIG. 8A is a schematic plan view illustrating a flexible display device 500 according to another embodiment of the present invention. FIGS. 8B, 8C, and 8D are schematic plan views illustrating the flexible display device 500 that is deformed when external light is incident on the flexible display device 500 of FIG. 8A.

In reference to FIG. 8A, the flexible display device 500 includes a flexible display panel 540 and a deformation member 520.

The deformation member 520 is located at the corner of the flexible display device 500, and a longitudinal direction of the deformation member 520 may face the corner.

In one embodiment, the longitudinal direction of the deformation member 520 passes through a corner of the flexible display device 500. In addition, the deformation member 520 may be located at the top of the flexible display device 500, and a plurality of the deformation members 520 may be formed. When the plurality of deformation members 520 are formed, each plurality of deformation members 520 may be independently deformed.

In reference FIG. 8B, when the deformation member 520 is deformed due to external light that is incident on the flexible display device 500, the flexible display device 500 is deformed, thereby allowing the external light to be blocked. The external light may be sunlight.

The deformation member 520 may be bent in a direction in which an image is displayed by the flexible display device 500. Accordingly, an upper portion of the flexible display device 500 is bent, and thus the external light is blocked, thereby allowing influence due to reflection by the external light to be reduced. In other words, the flexible display device 500 itself blocks the external light so that the same effect may be obtained as in the case where a clear image is also viewed even outdoors by shielding the external light 180 with user's hands. Therefore, the problem may be solved of a decrease in visibility occurring when the external light is directly incident on a display unit of the flexible display device 500 because the deformation member 520 is bent due to the external light. However, the present invention is not limited thereto, and the deformation member 520 may be deformed in various forms, and thus the flexible display device 500 may be deformed in various forms.

In reference to FIGS. 8C and 8D, only the deformation member 520 located at one corner may be bent depending on the direction of the external light. Thus, when the external light is incident leftward, only the deformation member 520 located at the left corner is bent as shown in FIG. 8C so as to block the external light. Similarly, when the external light is incident rightward, only the deformation member 520 located at the right corner is bent as shown in FIG. 8D so as to block the external light.

Figure 9A:
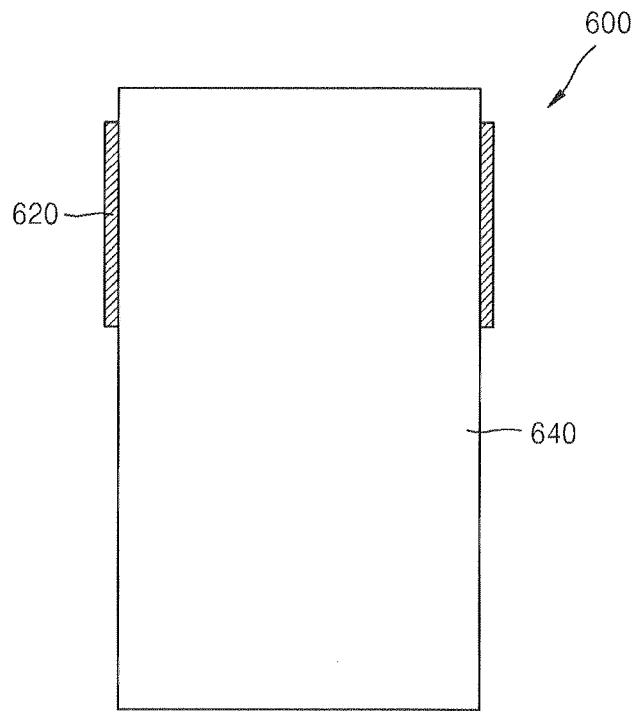
FIG. 9A is a schematic plan view illustrating a flexible display device according to another embodiment of the present invention.
Figure 9B:
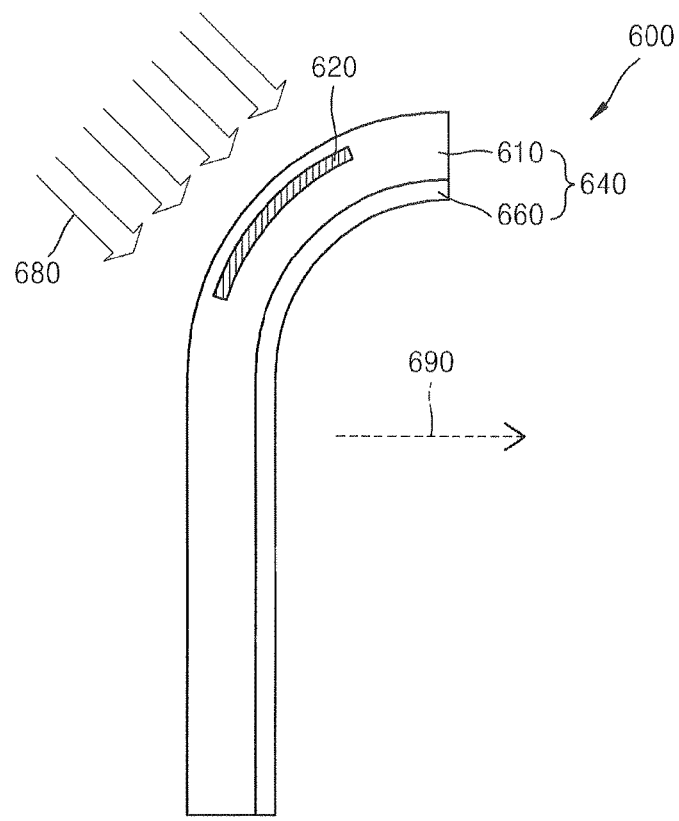
FIG. 9B is a schematic side view illustrating the flexible display device that is deformed when external light is incident on the flexible display device of FIG. 9A.

FIG. 9A is a schematic plan view illustrating a flexible display device 600 according to another embodiment of the present invention. FIG. 9B is a schematic side view illustrating the flexible display device 600 that is deformed when external light 680 is incident on the flexible display device 600 of FIG. 9A.

In reference to FIGS. 9A and 9B, the flexible display device 600 includes a flexible display panel 640 and a deformation member 620. The flexible display panel 640 includes a flexible substrate 610 and a display unit 660.

The deformation member 620 is provided on a lateral surface of the flexible display device 600. The deformation member 620 may be located at the top of the flexible display device 600, and a plurality of the deformation members 620 may be formed. When the plurality of deformation members 620 are formed, each deformation member 620 may be independently deformed.

When the deformation member 620 is deformed due to the external light 680 that is incident on the flexible display device 600, the flexible display device 600 is deformed accordingly, thereby allowing the external light 680 to be blocked. The external light 680 may be sunlight.

The deformation member 620 may be bent in a direction 690 in which an image is displayed by the flexible display device 600. Accordingly, an upper portion of the flexible display device 600 is bent, and thus external light 680 is blocked, thereby allowing influence due to reflection by the external light to be reduced. In other words, the flexible display device 600 itself blocks the external light 680 so that the same effect may be obtained as in the case where a clear image is also viewed even outdoors by shielding the external light 680 with user's hands. Therefore, the problem may be solved of a decrease in visibility occurring when the external light 680 is directly incident on the display unit 660 of the flexible display device 600 because the deformation member 620 is bent due to the external light 680. However, the present invention is not limited thereto, and the deformation member 620 may be deformed in various forms, and thus the flexible display device 600 may be deformed in various forms.

Figure 10A:
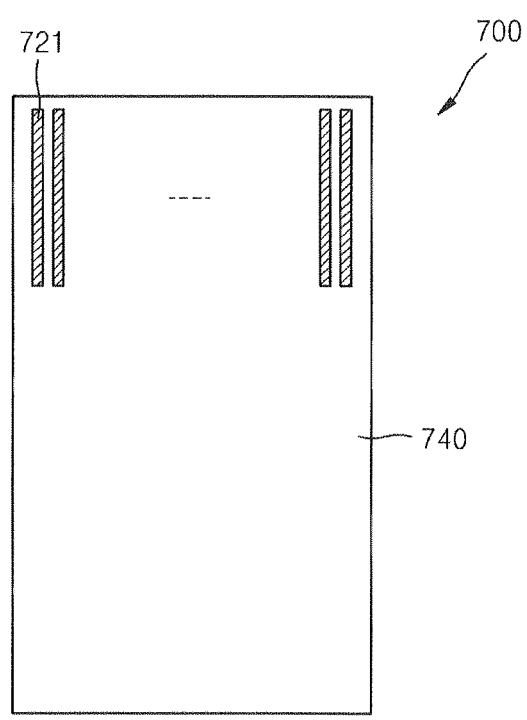
FIG. 10A is a schematic plan view illustrating a flexible display device according to another embodiment of the present invention.
Figure 10B:
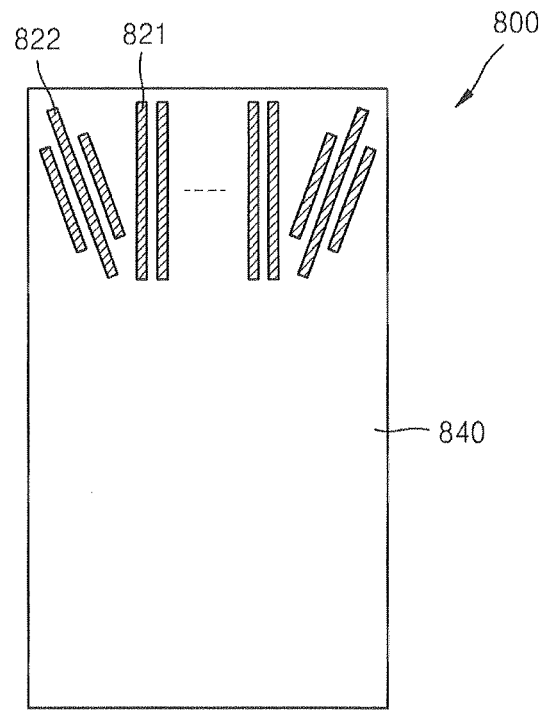
FIG. 10B is a schematic plan view illustrating a flexible display device according to another embodiment of the present invention.
Figure 10C:
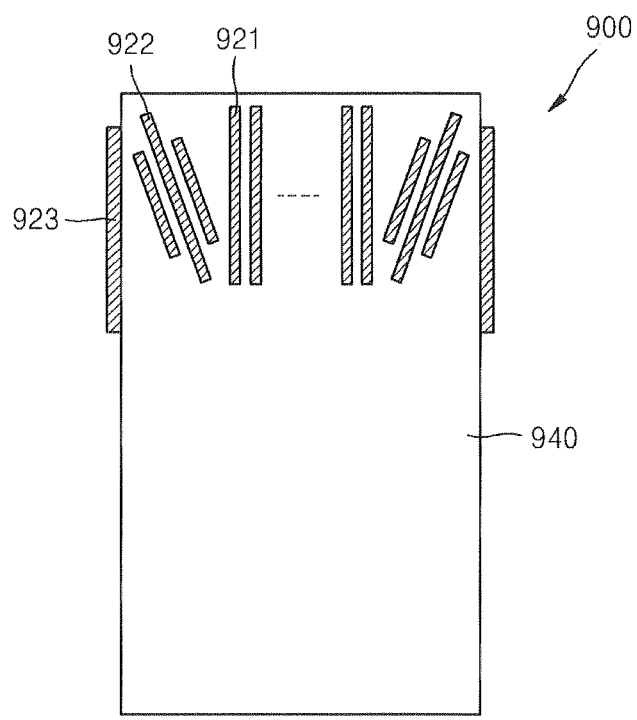
FIG. 10C is a schematic plan view illustrating a flexible display device according to another embodiment of the present invention.

FIG. 10A is a schematic plan view illustrating a flexible display device 700 according to another embodiment of the present invention. FIG. 10B is a schematic plan view illustrating a flexible display device 800 according to another embodiment of the present invention. FIG. 10C is a schematic plan view illustrating a flexible display device 900 according to another embodiment of the present invention.

In reference to FIG. 10A, the flexible display device 700 includes a flexible display panel 740 and a deformation member 721. A plurality of the deformation members 721 may be formed in a line on the top of the flexible display device 700.

In reference to FIG. 10B, the flexible display device 800 includes a flexible display panel 840 and deformation members 821 and 822. Some deformation members 821 are formed in a line on the top of the flexible display device 800. Some deformation members 822 are located at the corner of the flexible display device 800, and a longitudinal direction of the deformation member 822 faces the corner of the flexible display device 800. A plurality of the deformation members 821 and a plurality of the deformation members 822 may be formed.

In reference to FIG. 10C, the flexible display device 900 includes a flexible display panel 940 and deformation members 921, 922, and 923. Some deformation members 921 are formed in a line on the top of the flexible display device 900. Some of deformation members 922 are located at the corner of the flexible display device 900, and a longitudinal direction of the deformation member 922 faces the corner of the flexible display device 900. Some deformation members 923 are located on a lateral surface of the flexible display device 900. A plurality of the deformation members 921, a plurality of the deformation members 922, and a plurality of the deformation members 923 may be formed.

In the above-described flexible display devices according to the embodiments of the present invention, the deformation member is disposed in the flexible display device, and thus the flexible display device is deformed due to the deformation member. Accordingly, the external light is blocked, and thus reflection by the external light is reduced, thereby allowing visibility to be improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A flexible display device comprising:
   a flexible display panel comprising a flexible substrate and a display unit disposed on the flexible substrate to display an image toward a predetermined direction;
   a deformation member disposed on the flexible substrate and being spaced apart from the display unit,
   the deformation member being deformed due to external light that is incident on the flexible display device, and the flexible display device blocking the external light by being deformed in accordance with the deformation of the deformation member; and
   a sensor unit that senses the external light,
   wherein when the external light is sensed and an intensity of the external light sensed by the sensor unit is equal to or greater than a predetermined value, a signal is applied to the deformation member, and the deformation member is bent in response to the signal only in the predetermined direction toward which the image is displayed by the display unit.

2. The flexible display device of claim 1,
   wherein when the external light is incident on the deformation member, the deformation member reacts to the external light and is bent in the direction toward which the image is displayed by the display unit.

3. The flexible display device of claim 2,
   wherein the deformation member is bent, and an upper portion of the flexible display is bent.

4. The flexible display device of claim 1,
   wherein a degree of deformation of the deformation member is proportional to the intensity of the external light sensed by the sensor unit.

5. The flexible display device of claim 1,
   wherein the deformation member is deformed, and thus an upper portion of the flexible display device is bent.

6. The flexible display device of claim 1, further comprising:
   a control unit that controls the deformation of the deformation member by controlling a signal applied to the deformation member on the basis of an intensity of the external light sensed by the sensor unit.

7. The flexible display device of claim 6,
   wherein when the deformation member is bent, an upper portion of the flexible display device is bent.

8. The flexible display device of claim 1,
   wherein the external light is sunlight.

9. The flexible display device of claim 1,
   wherein the deformation member is a piezoelectric element.

10. The flexible display device of claim 1,
    wherein the deformation member is located at a corner of the flexible display device, and a longitudinal direction of the deformation member faces the corner.

11. The flexible display device of claim 1,
    wherein the deformation member is located at the top of the flexible display device.

12. The flexible display device of claim 1,
    wherein the deformation member is located on a lateral surface of the flexible display device.

13. The flexible display device of claim 1,
    wherein a plurality of the deformation members are formed.

* * * * *